US012674594B2

(12) United States Patent
Nguyen

(10) Patent No.: US 12,674,594 B2
(45) Date of Patent: *Jul. 7, 2026

(54) AIR CURTAIN CONTAINMENT SYSTEM AND ASSEMBLY FOR DATA CENTERS

(71) Applicant: INERTECH IP LLC, Plano, TX (US)

(72) Inventor: Ken Nguyen, Danbury, CT (US)

(73) Assignee: INERTECH IP LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/600,741

(22) Filed: Mar. 10, 2024

(65) Prior Publication Data

US 2024/0295334 A1     Sep. 5, 2024

Related U.S. Application Data

(63) Continuation of application No. 17/329,132, filed on May 24, 2021, now Pat. No. 11,927,363, which is a
(Continued)

(51) Int. Cl.
*F24F 9/00* (2006.01)
*F24F 13/02* (2006.01)
*H05K 7/20* (2006.01)

(52) U.S. Cl.
CPC ............ *F24F 9/00* (2013.01); *F24F 13/0254* (2013.01); *H05K 7/20709* (2013.01); *H05K 7/20745* (2013.01); *F24F 2009/002* (2013.01)

(58) Field of Classification Search
CPC .... F24F 9/00; F24F 13/0254; F24F 2009/002; H05K 7/20709; H05K 7/20745
(Continued)

(56) References Cited

U.S. PATENT DOCUMENTS 3,362,469 A     1/1968  Erling et al.
5,145,459 A     9/1992  Meline et al.
(Continued)

FOREIGN PATENT DOCUMENTS

AU     2014271273 B2     2/2017
CN       102905507 B     8/2013
(Continued)

*Primary Examiner* — Steven B McAllister
*Assistant Examiner* — Charles R Brawner
(74) *Attorney, Agent, or Firm* — Weber Rosselli & Cannon LLP

(57)     ABSTRACT

An air curtain containment system and assembly for data centers forms an air curtain over the server cabinets thereby separating hot air in a hot aisle from cool ambient air. The air curtain containment system includes ducts which include a hot air intake section that receives hot air discharged from servers, which are disposed in server cabinets. The ducts include heat exchangers for cooling the hot air and at least one air curtain discharge section. A housing is coupled to a wall of the ducts, and includes a cooling edge device fan. The cooling edge device fan is disposed along the ducts, and is configured to draw the hot air for cooling through the heat exchangers. An air curtain fan assembly is disposed along the ducts. The air curtain fan assembly expels cold air through the air curtain discharge section, and thereby forms an air curtain over the server cabinets.

20 Claims, 3 Drawing Sheets

Related U.S. Application Data continuation of application No. 15/695,807, filed on Sep. 5, 2017, now Pat. No. 11,015,824.

(60) Provisional application No. 62/382,984, filed on Sep. 2, 2016.

(58) Field of Classification Search
USPC ......................................................... 454/191
See application file for complete search history.

(56) References Cited

U.S. PATENT DOCUMENTS

| | | | | |
|---|---|---|---|---|
| 6,210,267 | B1 | 4/2001 | Long et al. | |
| 6,334,812 | B2 | 1/2002 | Laborde et al. | |
| 6,595,429 | B1 | 7/2003 | Carlson et al. | |
| 7,819,729 | B2 | 10/2010 | Rohrer et al. | |
| 9,551,500 | B2 | 1/2017 | Berben et al. | |
| 11,015,824 | B2 * | 5/2021 | Nguyen | H05K 7/20709 |
| 11,927,363 | B2 * | 3/2024 | Nguyen | H05K 7/20709 |
| 2006/0042288 | A1 | 3/2006 | Downs | |
| 2007/0135032 | A1 * | 6/2007 | Wang | H05K 7/20745 454/184 |
| 2012/0244015 | A1 | 9/2012 | Benson et al. | |
| 2012/0300391 | A1 | 11/2012 | Keisling et al. | |
| 2013/0264027 | A1 | 10/2013 | Eckberg et al. | |

FOREIGN PATENT DOCUMENTS

| | | |
|---|---|---|
| EP | 0362958 A1 | 4/1990 |
| WO | 2011043669 A2 | 4/2011 |

* cited by examiner

AIR CURTAIN CONTAINMENT SYSTEM AND ASSEMBLY FOR DATA CENTERS

CROSS-REFERENCE TO RELATED PATENT APPLICATION

The present application is a continuation of U.S. patent application Ser. No. 17/329,132 filed May 24, 2021, now allowed; which is a continuation of U.S. patent application Ser. No. 15/695,807 filed Sep. 5, 2021, now U.S. Pat. No. 11,015,824 which claims priority to U.S. provisional patent application titled "Air curtain containment system for data center," Appl. No. 62/382,984, filed on Sep. 2, 2016, the contents of which are incorporated by reference herein in their entirety.

FIELD OF THE DISCLOSURE

The present disclosure is generally related to data centers, and more particularly related to an air curtain containment system and assembly for the data centers.

BACKGROUND

The subject matter disclosed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which, in and of themselves, may also correspond to implementations of the claimed technology.

Computer equipment manufacturers have expanded data collection and storage capabilities of servers in data centers. The data centers contain hundreds of the servers in racks, resulting in large amounts of heat. The expansion of the capabilities of the servers leads to an increase in total power consumption, total heat output per server, and total heat output per server rack assembly in the data centers. Also, the expansion of the capabilities of the servers leads to an increase in power and temperature control requirements for computer data collection and storage.

Currently, cooling systems are used to handle the heat discharged from the servers in the data centers. However, the cooling systems for the servers in the racks are struggling to keep pace with the ability to cool ever increasing heat from the servers in the data centers. For example, some server racks in data centers produce outputs in excess of 35 kW, which is similar to the IBM® Blue Gene®. Also, the cooling systems require more space within the data centers to handle the large amounts of heat.

Further, the cooling systems are designed to concentrate the cooling at the server rack assembly. For example, hot aisle containment systems have been designed to separate cool ambient air from the hot air discharged from the servers. The hot aisle containment systems include physical structures, such as panels, having adjustable height and/or width to fit dimensions of a wide variety of sizes of servers disposed in server cabinets. For example, the panels are customized according to the size of the server cabinets. However, installing physical barriers in the data centers may be troublesome and costly. Also, the hot aisle containment systems and/or the cooling systems may be complex to install.

SUMMARY

In one aspect of the present disclosure, an air curtain containment system for data centers is provided. The air curtain containment system includes one or more ducts. The one or more ducts are configured to extend across a width of an aisle separating two rows of server cabinets. The one or more ducts include a hot air intake section configured to receive hot air discharged from one or more servers. The one or more servers may be disposed in server cabinets having different sizes or heights. The hot air intake section is configured as one of a partially obstructed opening and an unobstructed opening. Further, the one or more ducts include heat exchangers for cooling the hot air and at least one air curtain discharge section. The heat exchangers are positioned over the hot air intake section. A heat exchanger among the heat exchangers is used for cooling the hot air. The heat exchanger includes a plurality of rows coupled together in a counter-flow configuration.

Further, the air curtain containment system includes at least one housing coupled to a wall of the one or more ducts. The at least one housing includes at least one cooling edge device fan disposed along the one or more ducts. The at least one cooling edge device fan is configured to draw the hot air for cooling through the heat exchangers. The at least one housing further comprises at least one cool air exhaust section to expel cold air to ambience. The at least one cool air exhaust section is implemented as a window covered by a safety wire. Further, the at least one housing is of cylindrical shape or conical shape. At least one air curtain fan assembly is disposed along the one or more ducts. The at least one air curtain fan assembly is configured to expel the cold air through the at least one air curtain discharge section, thereby forming an air curtain over the server cabinets.

The at least one air curtain fan assembly includes a plurality of fans disposed on each side of the one or more ducts. The plurality of fans includes a plurality of inlets configured to draw in a portion of the cold air flowing from the heat exchanger and a plurality of outlets configured to discharge the cold air into a pipe. The pipe extends between different combinations of the plurality of fans. Further, the at least one air curtain fan assembly includes at least one opening along a length of the pipe for directing the cold air out of the at least one opening, and forming the air curtain over the server cabinets. In embodiments, the at least one opening is a slit extending along a length of the pipe, a plurality of slits, a plurality of nozzles, or a plurality of circular apertures. The air curtain is configured to create a barrier between a hot aisle and a cold aisle or cold or cooled air area outside of the hot aisle.

In another aspect, the present disclosure features an air curtain containment assembly for a plurality of information technology (IT) racks. The air curtain containment assembly includes at least one heat exchanger for cooling hot air in a hot aisle formed by the plurality of IT racks. In some embodiments, the at least one heat exchanger may include a plurality of rows coupled together in a counter-flow configuration. The air curtain containment assembly includes a first plurality of fans disposed above the at least one heat exchanger and configured to draw the hot air through the at least one heat exchanger. Further, the air curtain containment assembly includes an enclosure forming an at least partially enclosed volume between the at least one heat exchanger and the first plurality of fans.

The air curtain containment assembly further includes at least one air distribution duct disposed along at least one portion of the length of one of the at least one heat exchanger and the enclosure. Further, a second plurality of fans are disposed on the enclosure and configured to draw air cooled by the at least one heat exchanger from the at least partially enclosed volume into the at least one air distribution duct. The at least one air distribution duct is configured to form the cooled air into an air curtain extending to the IT racks.

The air curtain containment assembly further includes a plurality of fans coupled to the at least one air distribution duct. Each fan includes an inlet configured to draw in a portion of cold air flowing from the at least one heat exchanger. Further, each fan includes an outlet configured to discharge the cold air into the at least one air distribution duct. The at least one air distribution duct may extend between the plurality of fans. The at least one air distribution duct includes at least one opening along a length of the air distribution duct for directing the cold air out of the at least one opening and forming the air curtain extending to the plurality of IT racks. In embodiments, the at least one opening is a slit extending along at least one of the length of the at least one air distribution duct, a plurality of slits, a plurality of nozzles, or a plurality of circular apertures. In embodiments, the air curtain is configured to create a barrier between the hot aisle and a cold aisle outside of the hot aisle.

In yet another aspect, the present disclosure features an air curtain containment assembly for a plurality of information technology (IT) racks. The air curtain containment assembly includes at least one heat exchanger for cooling hot air generated by the plurality of IT racks. Further, at least one first fan is configured to draw the hot air through the at least one heat exchanger to cool the hot air. The air curtain containment assembly further includes at least one air distribution duct disposed near the plurality of IT racks. Further, the air curtain containment assembly includes an enclosure forming an at least partially enclosed volume between the at least one heat exchanger and the at least one first fan. Further, at least one second fan is configured to draw air cooled by the at least one heat exchanger into the at least one air distribution duct. The at least one air distribution duct is configured to form the cooled air into an air curtain to separate the hot air generated by the plurality of IT racks from cool ambient air.

Other features and aspects of this disclosure will be apparent from the following description and the accompanying drawings.

BRIEF DESCRIPTION OF THE DRAWINGS

The accompanying drawings illustrate various embodiments of systems, and embodiments of various other aspects of the disclosure. Any person with ordinary skills in the art will appreciate that the illustrated element boundaries (e.g., boxes, groups of boxes, or other shapes) in the figures represent one example of the boundaries. It may be that in some examples one element may be designed as multiple elements or that multiple elements may be designed as one element. In some examples, an element shown as an internal component of one element may be implemented as an external component in another, and vice versa. Furthermore, elements may not be drawn to scale. Non-limiting and non-exhaustive descriptions are described with reference to the following drawings. The components in the figures are not necessarily to scale, emphasis instead being placed upon illustrating principles.

DETAILED DESCRIPTION

Figure 1:
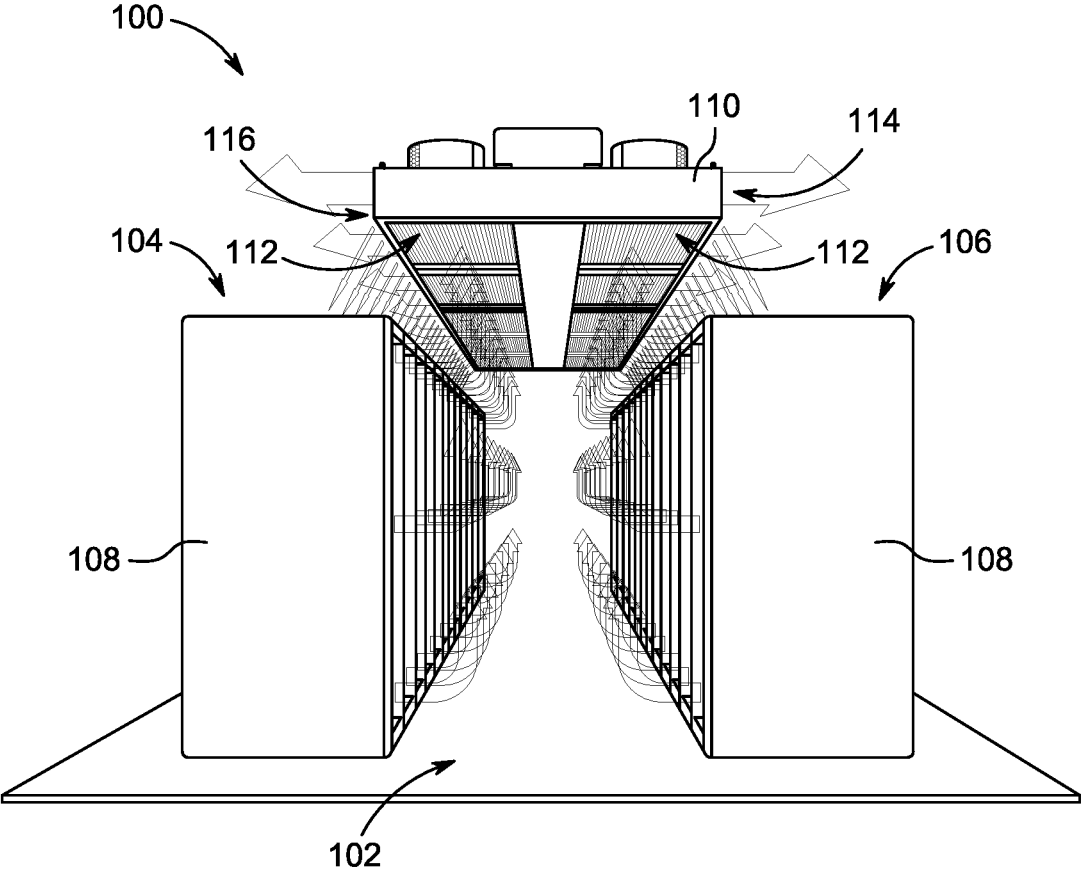
FIG. 1 is an end view of an air curtain containment system 100 for data centers, according to embodiments of the present disclosure.

Some embodiments of this disclosure, illustrating all its features, will now be discussed in detail. The words "comprising," "having," "containing," and "including," and other forms thereof, are intended to be equivalent in meaning and be open ended in that an item or items following any one of these words is not meant to be an exhaustive listing of such item or items, or meant to be limited to only the listed item or items.

It must also be noted that as used herein and in the appended claims, the singular forms "a," "an," and "the" include plural references unless the context clearly dictates otherwise. Although any systems and methods similar or equivalent to those described herein can be used in the practice or testing of embodiments of the present disclosure, the preferred, systems and methods are now described.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Data centers may consume large amounts of energy to neutralize heat output from thousands of servers employed in the data centers. An efficient way of cooling the data centers is using hot aisle containment systems and cooling edge devices placed over a hot aisle containment volume. The hot aisle containment systems may be created to separate cool ambient air from the hot air discharged from the servers and to allow cooling edge devices to absorb heat from the hot air. The hot aisle containment systems may use structural components and panels. In one case, the hot aisle containment systems may be designed to work with a particular type and a particular size of server cabinets to create a proper seal or containment for better heat concentration. To overcome the difference in height and width of the server cabinets, the hot aisle containment systems may include adjustable structures and panels to obtain appropriate or desired sealing or containment. However, the adjustable structures and panels may significantly increase the cost and complexity of the hot aisle containment systems.

The hot aisle containment systems of this disclosure may use air to create a separation between cool ambient air and hot air discharged from servers. In embodiments, a high-velocity air curtain creates an invisible separation that may allow the hot air to enter cooling edge devices with minimal mixing with the cool ambient air. Embodiments of this disclosure may allow users to eliminate or reduce a number of structural components and/or panels needed to create the hot aisle containment systems while maintaining efficiency of the cooling system. Embodiment of this disclosure may give users flexibility to use different types and sizes of server cabinets without necessitating any changes to the structure of the server cabinets.

FIG. 1 is an end view of an air curtain containment system 100 for data centers, according to embodiments of the present disclosure. The air curtain containment system 100 may be installed over an aisle 102 separating a first row 104 and a second row 106 of server cabinets 108. The server cabinets 108 may be disposed in a side-by-side arrangement. The server cabinets 108 may include one or more servers having different dimensions. Further, the server cabinets 108 may have varying widths, heights, and/or sizes depending on the dimensions of the servers disposed in the server cabinets 108.

The air curtain containment system 100 may include one or more ducts or enclosures 110. In an alternate embodiment, the air curtain containment system 100 may be disposed within the one or more ducts 110. The one or more ducts 110 may be configured to extend at least a length of the aisle 102. In an embodiment, the one or more ducts 110 may be configured to extend across a width of the aisle 102 separating different rows (i.e., the first row 104 and the second row 106) of the server cabinets 108. The one or more ducts 110 may be extended across the width of the aisle 102 to overhang a portion of each of the first row 104 and the second row 106 of the server cabinets 108.

As shown in FIG. 1, the one or more ducts 110 may include a hot air intake section 112, heat exchangers 114, and at least one air curtain discharge section 116. The hot air intake section 112 may be configured to receive hot air discharged from the one or more servers disposed in the server cabinets 108. In an embodiment, the hot air intake section 112 may be configured as one of a partially obstructed opening and an unobstructed opening. For example, the hot air intake section 112 may be configured as a perforated panel. It will be apparent to a person skilled in the art that the hot air intake section 112 may be configured in a single row. In another embodiment, the hot air intake section 112 may be configured as two rows, without departing from the scope of the disclosure.

Further, the hot air may be directed into the heat exchangers 114. The heat exchangers 114 may be positioned over the hot air intake section 112. In an embodiment, the heat exchangers 114 may be suspended over the hot air intake section 112. In another embodiment, the heat exchangers 114 may be positioned across inner edges of a structure defining an opening of the hot air intake section 112. In an alternate embodiment, the heat exchangers 114 may be positioned on a surface of a panel forming a portion of the hot air intake section 112. The heat exchangers 114 may be configured for cooling the hot air discharged from the one or more servers in the server cabinets 108. In one embodiment, a heat exchanger of the heat exchangers 114 may be used for cooling the hot air. Also, the heat exchangers 114 may be two or more rows coupled together in a counter-flow configuration, as described in commonly-owned International Application Number PCT/US17/48969 titled "Cooling Systems and Methods Using Single-Phase Fluid and a Flat Tube Heat Exchanger with Counter-Flow Circuiting," the entire contents of which are incorporated by reference herein.

Figure 2:
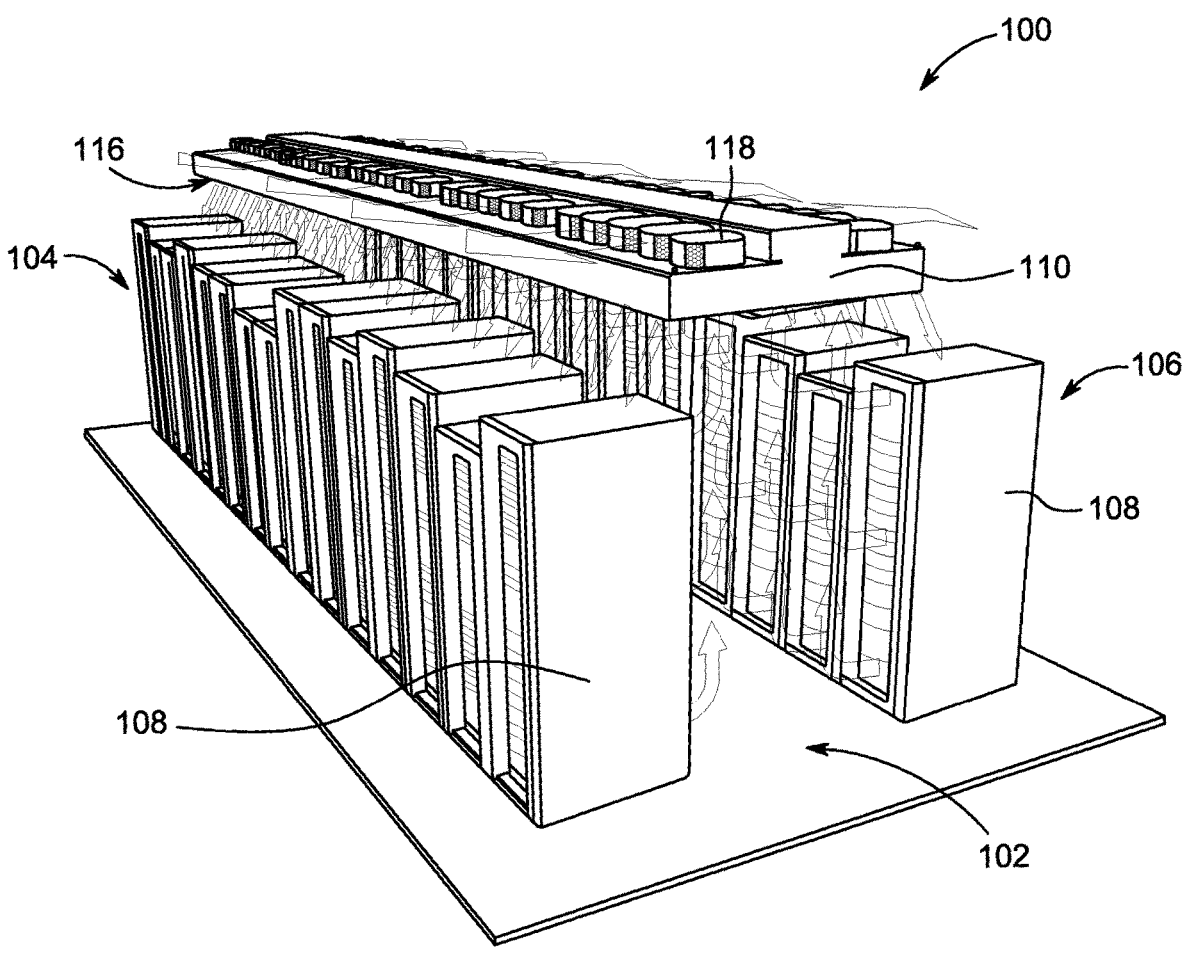
FIG. 2 is a perspective view of the air curtain containment system 100 of FIG. 1, according to embodiments of the present disclosure.
Figure 3:
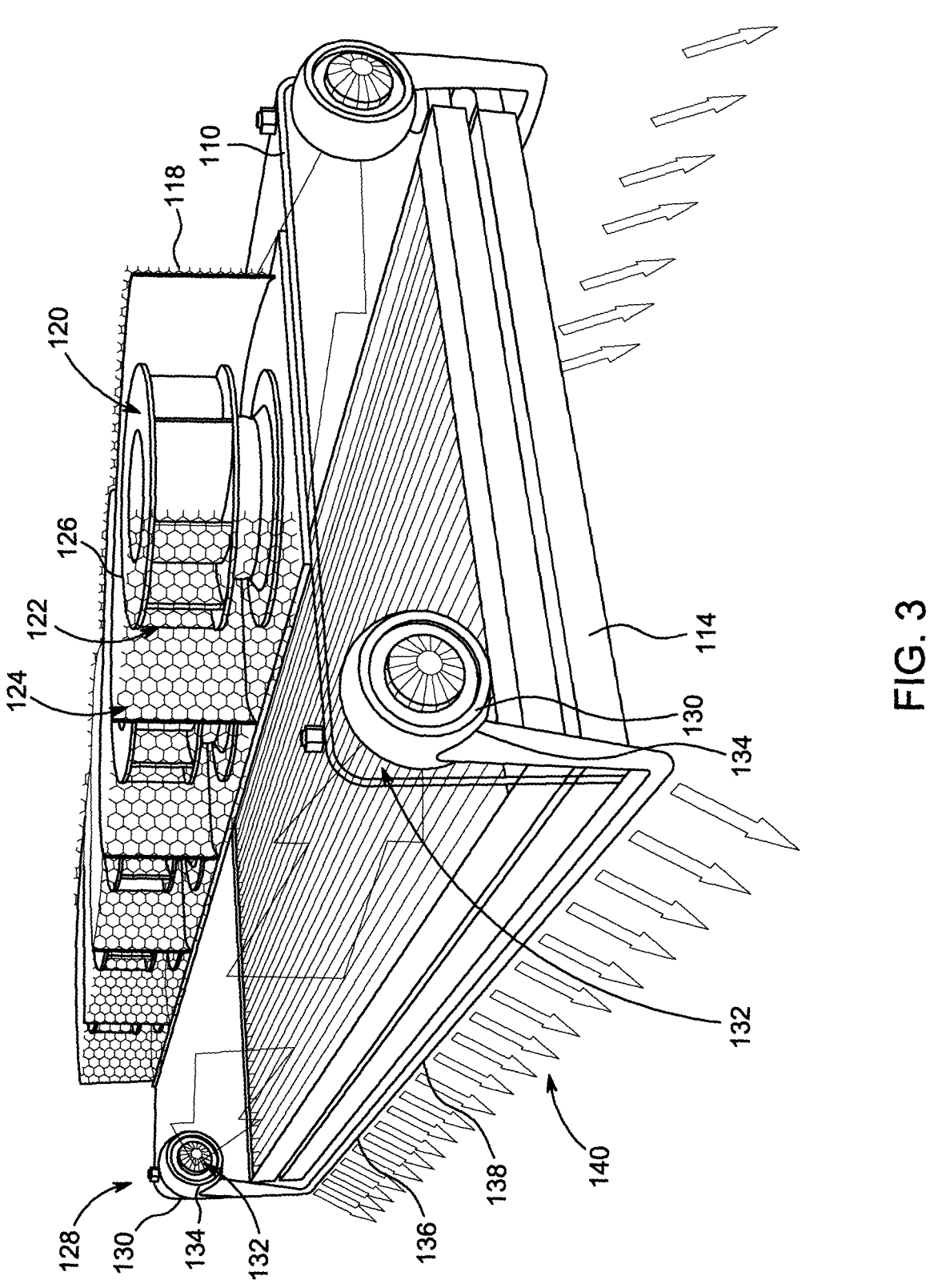
FIG. 3 is a perspective view of at least one air curtain fan assembly 128 along with at least one cooling edge device fan 120 for use in the air curtain containment system 100 of FIG. 1, according to embodiments of the present disclosure.

As shown in FIGS. 2 and 3, the air curtain containment system 100 may further include at least one housing 118. The at least one housing 118 may be coupled to a wall of the one or more ducts 110. It should be noted that the at least one housing 118 may be coupled to the wall of the one or more ducts 110 over an air opening (not shown). Further, the at least one housing 118 may include at least one cooling edge device fan 120. The at least one cooling edge device fan 120 may be disposed along the one or more ducts 110. The at least one cooling edge device fan 120 may be configured to draw the hot air for cooling through the heat exchangers 114. It should be noted that a single cooling edge device fan 120 may also be used for cooling through the heat exchangers 114, without departing from the scope of the disclosure.

Further, the at least one housing 118 may include at least one cool air exhaust section 122. In an embodiment, the at least one cool air exhaust section 122 may be implemented as a window 124 covered by a safety wire 126. The at least one cool air exhaust section 122 may be configured to expel the cold air to ambience. It should be noted that a portion of the cold air may be drawn into the air opening and expelled through the window 124 of the at least one cool air exhaust section 122 to the ambience. In an embodiment, the at least one housing 118 may be in one of a cylindrical shape and a conical shape. It will be apparent to a person skilled in the art that shapes mentioned above have been provided only for illustration purposes. In an embodiment, the at least one housing 118 may be of different shapes such as rectangle, square etc. as well, without departing from the scope of the disclosure.

Further, the air curtain containment system 100 includes at least one air curtain fan assembly 128. The at least one air curtain fan assembly 128 may be disposed along the one or more ducts 110. The at least one air curtain fan assembly 128 may be configured to expel the cold air through the at least one air curtain discharge section 116. It should be noted that another portion of the cold air may be expelled through the at least one air curtain discharge section 116. In an embodiment, the at least one air curtain fan assembly 128 may include a plurality of fans 130. The plurality of fans 130 may be disposed on each side of the one or more ducts 110. For example, the plurality of fans 130 may be mounted to end walls of the one or more ducts 110. In an embodiment, the plurality of fans 130 may be circular in shape. It should be noted that the plurality of fans 130 may be of some other shapes as well, without departing from the scope of the disclosure.

Further, the plurality of fans 130 may include a plurality of inlets 132 and a plurality of outlets 134. The plurality of inlets 132 may be configured to draw a portion of the cold air from the heat exchangers 114. Thereafter, the plurality of outlets 134 may be configured to allow the cold air to be discharged into a pipe 136. The pipe 136 may extend between two of the plurality of fans 130. Further, the at least one air curtain fan assembly 128 may include at least one slit 138 extending along a length of the pipe 136. In one embodiment, the at least one air curtain fan assembly 128 may include at least one opening. In one case, the at least one opening may be a slit 138, extending along a length of the pipe. The at least one opening may also be a plurality of slits, a plurality of nozzles, or a plurality of circular apertures. The at least one slit 138 may be configured to direct the cold air out of the at least one slit 138, thereby forming an air curtain 140 over the server cabinets 108. The air curtain 140 (e.g., a high-velocity air curtain) may be configured to create a barrier between the hot air and the cold air.

The direction of the at least one slit 138 may be customized to allow the air curtain 140 to be angled relative to a plane including at least one of top surfaces of the server cabinets 108. It will be apparent to one skilled in the art that instead of a single slit 138 extending along the length of the pipe 136, a series of slits may be arranged end to end, an array of apertures, a combination of slits and apertures or the like may be implemented, without departing from the scope of the disclosure.

In one embodiment, an air curtain containment assembly 100 for a plurality of information technology (IT) racks may be disclosed. The air curtain containment assembly 100 may include at least one heat exchanger for cooling hot air in a hot aisle formed by the plurality of IT racks. The at least one heat exchanger may include a plurality of rows coupled together in a counter-flow configuration. The air curtain containment assembly 100 may include a first plurality of fans disposed above the at least one heat exchanger. It should be noted that the first plurality of fans may be similar to the at least one cooling edge device fan 120 described above. The first plurality of fans may be configured to draw the hot air through the at least one heat exchanger. Further, the air curtain containment assembly 100 may include an enclosure forming an at least partially enclosed volume between the at least one heat exchanger 114 and the first plurality of fans 120. It should be noted that the enclosure may be similar to the at least one housing 118 described above.

In one embodiment, the air curtain containment assembly 100 may include at least one air distribution duct disposed along at least one portion of one of the length of the at least one heat exchanger and the enclosure. It should be noted that the at least one air distribution duct may be similar to the at least one air curtain discharge section 116 described above. Further, the air curtain containment assembly 100 may include a second plurality of fans disposed on the enclosure. The second plurality of fans may be configured to draw air cooled by the at least one heat exchanger from the at least partially enclosed volume into the at least one air distribution duct. The at least one air distribution duct may be configured to form the cooled air into the air curtain 140 extending to the IT racks.

Further, the air curtain containment assembly 100 may include at least one air curtain fan assembly 128. The at least one air curtain fan assembly 128 may include the plurality of fans 130 coupled to the at least one air distribution duct. The at least one air distribution duct may extend between the plurality of fans 130. Each fan may include an inlet configured to draw in a portion of cold air flowing from the at least one heat exchanger. It should be noted that the inlet may be similar to the plurality of inlets 132 described above.

Further, each fan may include an outlet configured to discharge the cold air into the at least one air distribution duct. It should be noted that the outlet may be similar to the plurality of outlets 134 described above. The at least one air curtain fan assembly may include at least one opening along a length of the air distribution duct for directing the cold air out of the at least one opening, and forming the air curtain 140 extending to the plurality of IT racks. In one case, the at least one opening may be the slit 138 extending along at least one of the length of the at least one air distribution duct. The at least one opening may be a plurality of slits, a plurality of nozzles, or a plurality of circular apertures. The air curtain 140 may be configured to create a barrier between the hot aisle and the cold aisle outside of the hot aisle. The at least one opening may be a design that optimizes the separation of the hot aisle from the cool ambient air outside of the hot aisle.

In another embodiment, the air curtain containment assembly 100 for a plurality of information technology (IT) racks may be disclosed. The air curtain containment assembly 100 may include the at least one heat exchanger for cooling hot air generated by the plurality of IT racks. Further, at least one first fan may be configured to draw the hot air through the at least one heat exchanger to cool the hot air. It should be noted that the at least one first fan may be similar to the at least one cooling edge device fan 120 described above. The air curtain containment assembly 100 may further include at least one air distribution duct disposed near the plurality of IT racks. It should be noted that the at least one air distribution duct may be similar to the at least one air curtain discharge section 116 described above. Further, the air curtain containment assembly 100 may include an enclosure forming an at least partially enclosed volume between the at least one heat exchanger and the at least one first fan. Further, at least one second fan may be configured to draw air cooled by the at least one heat exchanger into the at least one air distribution duct. The at least one air distribution duct may be configured to form the cooled air into the air curtain 140 to separate the hot air generated by the plurality of IT racks from cool ambient air.

The disclosed embodiments encompass numerous advantages. Various embodiments of the air curtain containment system 100 for the data centers may be disclosed. The air curtain containment system 100 may include the hot air intake section 112 to receive the hot air discharged from the one or more servers disposed in the server cabinets 108. Further, the at least one cooling edge device fan 120 may be configured to draw the hot air for cooling through the heat exchangers 114. Thereafter, the air curtain containment system 100 may include the at least one air curtain fan assembly 128 to expel the cold air through the at least one air curtain discharge section 116, and thereby forming the air curtain 140 (e.g., the high-velocity air curtain) over the server cabinets 108. Thus, the air curtain 140 (e.g., the high-velocity air curtain) may act as the barrier for the separation between the hot air and the cold air, and thereby prevents mixing of the cold air and the hot air.

Also, such types of the air curtain containment system 100 may result in eliminating the use of a solid containment system. Further, the air curtain containment system 100 may be applicable to different sizes and/or heights of the server cabinets 108 without changing an overall structure of the air curtain containment system 100. Thus, the air curtain containment system 100 is a cost effective, efficient, and easy-to-install structure.

It will be appreciated that variants of the above-described features, and other features and functions or alternatives thereof, may be combined into many other different systems or applications. Presently unforeseen or unanticipated alternatives, modifications, variations, or improvements therein may be subsequently made by those skilled in the art that are also intended to be encompassed by the following claims.

The invention claimed is:

1. An air curtain containment system comprising:
an enclosure defining a plenum, the plenum including:
    an air intake section configured to receive heated air discharged from one or more servers disposed in server cabinets; and
    at least one air curtain discharge section;
at least one heat exchanger disposed at the air intake section and configured to cool the heated air; and
at least one housing coupled to a side of the enclosure defining the plenum, the at least one housing including:
    at least one cooling fan coupled to the enclosure defining the plenum, wherein the at least one cooling fan is configured to draw the heated air through the at least one heat exchanger; and
    at least one air curtain fan assembly coupled to the enclosure defining the plenum, wherein the at least one air curtain fan assembly is configured to expel cold air through the at least one air curtain discharge section to form an air curtain above the server cabinets.

2. The air curtain containment system of claim 1, wherein the enclosure defining the plenum is configured to extend across a width of an aisle separating two rows of the server cabinets.

3. The air curtain containment system of claim 1, wherein the air intake section is configured as one of a partially obstructed opening and an unobstructed opening.

4. The air curtain containment system of claim 1, wherein the at least one heat exchanger is positioned over the air intake section.

5. The air curtain containment system of claim 1, wherein the at least one housing further includes at least one cool air exhaust section to expel the cold air to ambience.

6. The air curtain containment system of claim 5, wherein the at least one cool air exhaust section is implemented as a window covered by a safety wire.

7. The air curtain containment system of claim 1, wherein the at least one housing is a cylindrical shape or a conical shape.

8. The air curtain containment system of claim 1, wherein the at least one air curtain fan assembly includes:

a pipe including at least one opening along a length of the pipe; and fans disposed on each side of the enclosure defining the plenum, wherein the fans include:

inlets configured to draw in a portion of the cold air flowing from the heat exchanger; and outlets configured to discharge the cold air into the pipe, wherein the pipe extends between the fans, and wherein the at least one opening of the pipe directs the cold air out of the at least one opening, and forms the air curtain above the server cabinets.

9. The air curtain containment system of claim 8, wherein the at least one opening is a slit extending along a portion of the pipe, at least one slit, at least one nozzle, or at least one circular aperture.

10. The air curtain containment system of claim 1, wherein the air curtain is configured to create a barrier between a hot aisle and a cold aisle.

11. The air curtain containment system of claim 1, wherein the heat exchanger includes rows coupled together in a counter-flow configuration.

12. The air curtain containment system of claim 1, wherein at least one server cabinet of the server cabinets has a different height than other server cabinets of the server cabinets.

13. An air curtain containment assembly comprising:

at least one heat exchanger for cooling heated air in a hot aisle formed by IT racks;

first fans in fluid communication with the at least one heat exchanger and configured to draw the heated air through the at least one heat exchanger;

an enclosure forming a volume between the at least one heat exchanger and the first fans;

at least one air distribution duct disposed adjacent to the enclosure; and second fans configured to draw cooled air cooled by the at least one heat exchanger from the volume into the at least one air distribution duct, wherein the at least one air distribution duct is configured to form the cooled air into an air curtain extending to at least a portion of the IT racks.

14. The air curtain containment assembly of claim 13, wherein the second fans are coupled to the at least one air distribution duct, wherein each fan of the second fans includes:

an inlet configured to draw in a portion of cold air flowing from the at least one heat exchanger; and an outlet configured to discharge the cold air into the at least one air distribution duct, wherein the at least one air distribution duct extends between the second fans, and wherein the at least one air distribution duct includes at least one opening along a portion of the air distribution duct for directing the cold air out of the at least one opening and forming the air curtain extending to the IT racks.

15. The air curtain containment assembly of claim 14, wherein the at least one opening is a slit extending along at least one of a length of the at least one air distribution duct, at least one slit, at least one nozzle, or at least one circular aperture.

16. The air curtain containment assembly of claim 13, wherein the air curtain is configured to create a barrier between the hot aisle and a cold aisle.

17. The air curtain containment assembly of claim 13, wherein the at least one heat exchanger includes rows coupled together in a counter-flow configuration.

18. The air curtain containment assembly of claim 13, wherein the second fans are disposed on the enclosure.

19. An air curtain containment system comprising:

at least one heat exchanger for cooling heated air generated by IT racks;

at least one first fan configured to draw the heated air through the at least one heat exchanger to cool the heated air, yielding cooled air;

at least one air distribution duct disposed near the IT racks; and at least one second fan configured to draw air cooled by the at least one heat exchanger into the at least one air distribution duct, wherein the at least one air distribution duct is configured to form the cooled air into an air curtain to separate the heated air generated by the IT racks from cool ambient air.

20. The air curtain containment system of claim 19, further comprising an enclosure forming an at least partially enclosed volume between the at least one heat exchanger and the at least one first fan.

\* \* \* \* \*